(12) United States Patent
Wang et al.

(10) Patent No.: US 10,943,846 B2
(45) Date of Patent: Mar. 9, 2021

(54) CHIP PACKAGE STRUCTURE WITH HEAT CONDUCTIVE COMPONENT AND MANUFACTURING THEREOF

(71) Applicant: Unimicron Technology Corp., Taoyuan (TW)

(72) Inventors: Tzu-Hsuan Wang, Taoyuan (TW); Chien-Chen Lin, Taoyuan (TW); Kuan-Wen Fong, Keelung (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 79 days.

(21) Appl. No.: 16/215,671

(22) Filed: Dec. 11, 2018

(65) Prior Publication Data
US 2020/0126883 A1    Apr. 23, 2020

(30) Foreign Application Priority Data

Oct. 17, 2018   (TW) .................................. 107136588

(51) Int. Cl.
| | |
|---|---|
| H01L 23/36 | (2006.01) |
| H01L 23/367 | (2006.01) |
| H01L 23/498 | (2006.01) |
| H01L 23/13 | (2006.01) |

(Continued)

(52) U.S. Cl.
CPC ...... H01L 23/3675 (2013.01); H01L 21/4857 (2013.01); H01L 23/13 (2013.01); H01L 23/49822 (2013.01); H01L 23/49838 (2013.01); H01L 24/08 (2013.01); H01L 24/89 (2013.01); *H01L 2224/08225* (2013.01); *H01L 2224/80001* (2013.01)

(58) Field of Classification Search
CPC ............... H01L 23/3675; H01L 2023/4068
See application file for complete search history.

(56) References Cited

U.S. PATENT DOCUMENTS

| | | | |
|---|---|---|---|
| 2012/0129299 A1* | 5/2012 | Lin ..................... | H01L 24/20 |
| | | | 438/118 |
| 2016/0351545 A1* | 12/2016 | Hong .................. | H01L 25/105 |
| 2017/0287825 A1* | 10/2017 | Lee ..................... | H01L 21/56 |

FOREIGN PATENT DOCUMENTS

| | | |
|---|---|---|
| TW | 200509338 A | 3/2005 |
| TW | 201110250 A | 3/2011 |
| TW | I470846 B | 1/2015 |

(Continued)

*Primary Examiner* — Lex H Malsawma
*Assistant Examiner* — Laura M Dykes
(74) *Attorney, Agent, or Firm* — CKC & Partners Co., LLC

(57) ABSTRACT

A chip package structure includes a circuit structure, a redistribution structure, a heat conductive component, a chip, and a heat sink. The circuit structure includes a first circuit layer. The redistribution structure is disposed on the circuit structure and includes a second circuit layer, wherein the redistribution structure has an opening. The heat conductive component is disposed on the circuit structure and covered by the redistribution structure. The heat conductive component has a horizontal portion and a vertical portion. The horizontal portion extends toward the opening until it exceeds the opening. The vertical portion extends upward beyond the top surface of the redistribution structure from a part of the horizontal portion. The chip is disposed in the opening, and the bottom of the chip contacts the heat conductive component. The heat sink is disposed over the redistribution structure and the chip.

7 Claims, 9 Drawing Sheets

(51) Int. Cl.
*H01L 21/48* (2006.01)
*H01L 23/00* (2006.01)

(56) References Cited

FOREIGN PATENT DOCUMENTS

| TW | I622149 B | 4/2018 |
| TW | 201824471 A | 7/2018 |

* cited by examiner

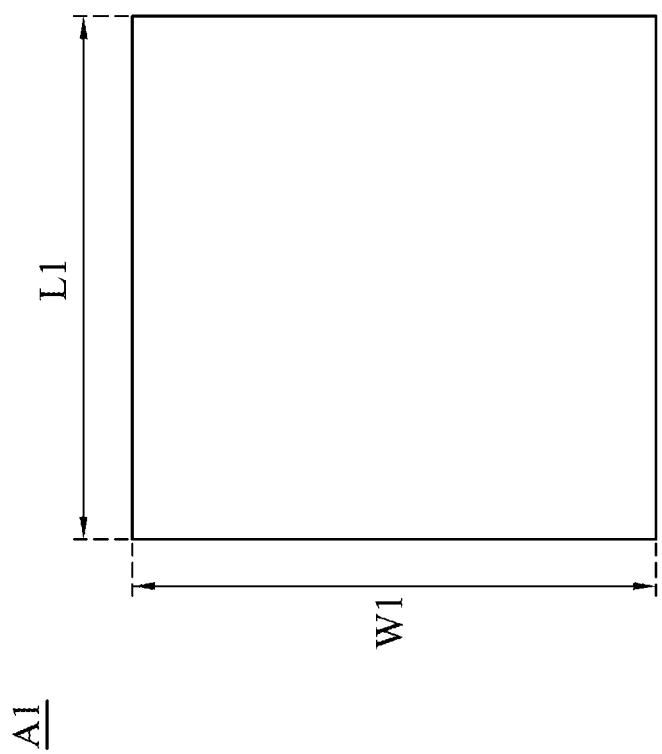

… … …

CHIP PACKAGE STRUCTURE WITH HEAT CONDUCTIVE COMPONENT AND MANUFACTURING THEREOF

CROSS-REFERENCE TO RELATED APPLICATION

This application claims priority to Taiwan Application Serial Number 107136588, filed Oct. 17, 2018, which is herein incorporated by reference in its entirety.

BACKGROUND

Field of Invention

The present invention is related to a chip package structure and a manufacturing method thereof.

Description of Related Art

With the improvement of chip performance, the energy consumption of chips also increases accordingly, which makes the build-up of waste heat in chips more serious. To ensure a stable operation, chip package structures typically include a heat sink disposed on the chip. Therefore, the heat sink is able to dissipate waste heat accumulated in the chip and avoid damage caused by waste heat build-up.

In a conventional chip package structure, there are several layers between the heat sink and the chip, such as encapsulation layers or adhesive materials for adhering to the heat sink. Therefore, in this design, the waste heat accumulated in the chip needs to pass through several layers to reach the heat sink, which causes poor heat dissipation.

SUMMARY

According to one aspect of this disclosure, a chip package structure is provided. The chip package structure comprises a circuit structure, a redistribution structure, a heat conductive component, a chip and a heat sink. The circuit structure includes a first circuit layer. The redistribution structure is disposed on the circuit structure and includes a second circuit layer electrically connected to the first circuit layer, in which the redistribution structure has an opening. The heat conductive component is disposed over the circuit structure and has a horizontal portion and a vertical portion. The horizontal portion has a first part embedded in the redistribution structure and a second part exposed by the opening. The vertical portion is extended upward from the first part of the horizontal portion and exceeds the top surface of the redistribution structure. The chip is disposed in the opening and electrically connected to the first circuit layer, in which the bottom of the chip contacts the second part of the horizontal portion of the heat conductive component. The heat sink is disposed over the redistribution structure and the chip, and the heat sink contacts a top of the chip and a top of the vertical portion of heat conductive component.

In an embodiment of the present disclosure, the heat conductive component is an L-shaped structure.

In an embodiment of the present disclosure, the heat sink is attached to the top of the chip and the top of the vertical portion of the heat conductive component by ultrasonic welding.

In an embodiment of the present disclosure, a horizontal distance of equal to or less than 50 μm is present between the vertical portion of the heat conductive component and a side wall of the chip.

In an embodiment of the present disclosure, the chip package structure further comprises a connection pad disposed between the redistribution structure and the heat sink and is in contact with the heat sink. The connection pad is electrically connected with the second circuit layer.

In an embodiment of the present disclosure, the chip package structure further comprises a protective material covering a side wall of the chip and filling a void between the circuit structure and the chip.

Another aspect of the present disclosure is to provide a method for manufacturing a chip package. The method comprises the following operations: (i) providing a precursor structure, wherein the precursor structure comprises: a circuit structure comprising a first circuit layer; a redistribution precursor structure disposed on the circuit structure and comprising a second circuit layer electrically connected with the first circuit layer; a heat conductive component disposed over the circuit structure and comprising: a horizontal portion embedded in the redistribution precursor structure; and a vertical portion extending upward from the horizontal portion and beyond a top surface of the redistribution precursor structure; and a patterned release film disposed on the circuit structure and covered by the redistribution precursor structure, wherein the patterned release film covers a part of the horizontal portion of the heat conductive component and a connection pad electrically connected with the first circuit layer; (ii) removing the patterned release film and a part of the redistribution precursor structure above the patterned release film to form an opening, wherein the opening exposes the connection pad and the part of the horizontal portion of the heat conductive component; (iii) disposing a chip in the opening, wherein the chip is electrically connected to the connection pad and a bottom of chip contacts the part of the horizontal portion of the heat conductive component; and (iv) attaching a heat sink to the chip and the vertical portion of the heat conductive component.

In an embodiment of the present disclosure, operation (i) comprises the steps of: (v) forming the horizontal portion of the heat conductive component on the circuit structure; (vi) forming the redistribution precursor structure to cover the horizontal portion of the heat conductive component; (vii) patterning the redistribution precursor structure to form a through hole exposing a part of the horizontal portion of the heat conductive component; and (viii) forming the vertical portion of the heat conductive component in the through hole.

In an embodiment of the present disclosure, operation (ii) comprises the steps of: (a) employing a laser drilling process to remove a part of the redistribution precursor structure which is in a vertical projection of a periphery of the patterned release film; and (b) removing the patterned release film and the part of the redistribution precursor structure above the patterned release film.

In an embodiment of the present disclosure, operation (iv) is carried out by ultrasonic welding.

The above description will be described in detail in the following embodiments, and further explanation of the technical solutions of the disclosure will be provided.

BRIEF DESCRIPTION OF THE DRAWINGS

FIG. 1C is a schematic view showing a contact surface between the chip and the heat conductive element in the chip package structure according to an embodiment of this disclosure.

DETAILED DESCRIPTION

In order to make the description of the present disclosure more detailed and complete, an illustrative description of embodiments of the present disclosure and specific embodiments is presented below. However, this is not the only form in which the specific embodiment of the present disclosure is implemented or utilized. The various embodiments disclosed below may be combined or replaced in a beneficial situation, and other embodiments may be attached to an embodiment. No further documentation or explanation is required. In the following description, numerous specific details are set forth to make readers fully understand the following embodiments. However, the disclosure of embodiments may be practiced without these specific details.

In addition, spatial relative terms, such as "below", "under", "above" and "over" are for the purpose of describing the relative relationship between one element or feature and another element or feature. The true meaning of these spatially relative terms includes other orientations. For example, when the pattern is flipped up and down 180 degrees, the relationship between one element and another element may be changed from "below", "under" to "above", "over". Therefore, the spatially relative narrative used in this paper should also be interpreted in the same way.

Figure 1A:
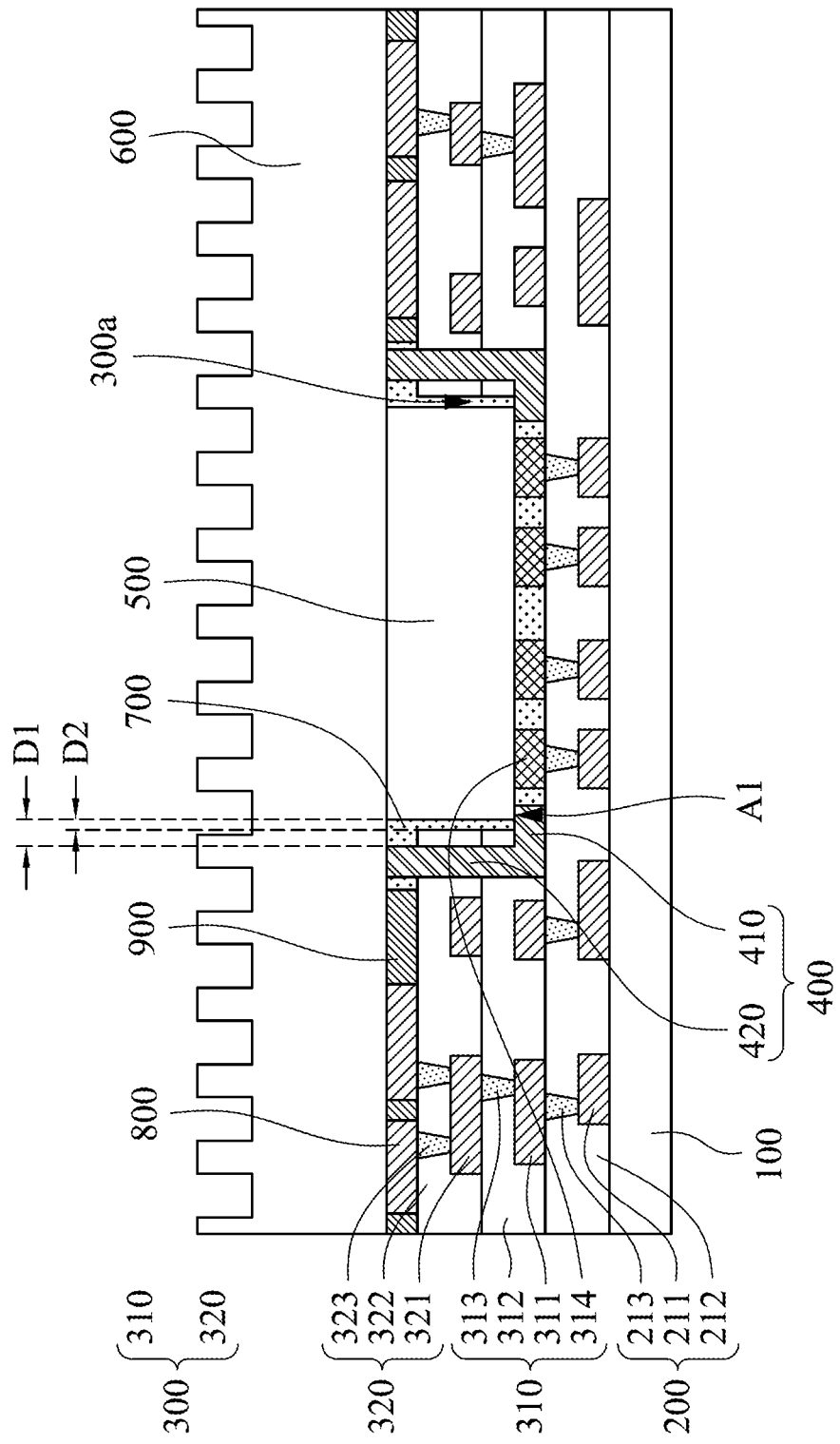
FIG. 1A is a schematic cross-sectional view showing a chip package structure according to an embodiment of this disclosure.

FIG. 1A is a cross-sectional view showing a chip package structure 10 according to an embodiment of the present disclosure. Please refer to FIG. 1A, the chip package structure 10 includes a protective substrate 100, a circuit structure 200, a redistribution structure 300, a heat conductive component 400, a chip 500 and a heat sink 600.

In some embodiments, the protective substrate 100 is a flexible substrate, such as a polyimide (PI) substrate. In other embodiments, the protective substrate 100 can be a rigid substrate, such as a glass substrate or a plastic substrate.

The circuit structure 200 is disposed on the protective substrate 100 and includes a first circuit layer 211, a first dielectric layer 212 and a first conductive contact 213. The first circuit layer 211 and the first conductive contact 213 are embedded in the first dielectric layer 212. In detail, a lower surface of the first circuit layer 211 and a lower surface of the first dielectric layer 212 are coplanar. The first conductive contact 213 connects to the first circuit layer 211, and an upper surface of the first conductive contact 213 is exposed from the first dielectric layer 212. In some embodiments, the first circuit layer 211 may include any suitable conductive material, such as copper, nickel, silver and the like. In some embodiments, the first dielectric layer 212 includes Ajinomoto Build-up Film (ABF), polyimide (PI) or photoimageable dielectric (PID). In some embodiments, the first conductive contact 213 can be a metal rod which includes, for example, copper, nickel, silver, or the like. It must be stated that although the circuit structure 200 shown in FIG. 1A includes only one circuit layer (e.g., the first circuit layer 211), but in other embodiments the circuit structure 200 may include two or more circuit layers.

The redistribution structure 300 is disposed on the circuit structure 200 and includes a first redistribution layer 310 and a second redistribution layer 320 disposed on the first redistribution layer 310.

The first redistribution layer 310 includes a second circuit layer 311, a second dielectric layer 312, a second conductive contact 313 and a connection pad 314. The second circuit layer 311 and the second conductive contact 313 are embedded in the second dielectric layer 312. In detail, the second circuit layer 311 and the connection pad 314 are in contact with the exposed portions of the first conductive contacts 213. In addition, the second circuit layer 311 and the connection pad 314 are electrically connected to the first circuit layer 211. A lower surface of the second circuit layer 311 and a lower surface of the second dielectric layer 312 are coplanar. The second conductive contact 313 connects to the second circuit layer 311, and an upper surface of the second conductive contact 313 is exposed from the second dielectric layer 312. In some embodiments, the second circuit layer 311 and the connection pad 314 may include any suitable conductive material, such as copper, nickel, silver and the like. In some embodiments, the second dielectric layer 312 includes ABF, PI or PID. In some embodiments, the second conductive contact 313 can be a metal rod which includes, for example, copper, nickel, silver or the like.

The second redistribution layer 320 includes a third circuit layer 321, a third dielectric layer 322 and a third conductive contact 323. The third circuit layer 321 and the third conductive contact 323 are embedded in the third dielectric layer 322. In detail, the third circuit layer 321 is in contact with the exposed portion of the second conductive contact 313. In addition, the third circuit layer 321 is electrically connected to the second circuit layer 311. A lower surface of the third circuit layer 321 and a lower surface of the third dielectric layer 322 are coplanar. The third conductive contact 323 connects to the third circuit layer 321 and an upper surface of the third conductive contact 323 is exposed from the third dielectric layer 322. In some embodiments, the third circuit layer 321 may include any suitable conductive material, such as copper, nickel, silver, or the like. In some embodiments, the third dielectric layer 322 includes ABF, PI or PID. In some embodiments, the third conductive contact 323 can be a metal rod which includes, for example, copper, nickel, silver or the like.

As shown in FIG. 1A, the redistribution structure 300 has an opening 300a. Specifically, the opening of the first redistribution layer 310 and the opening of the second redistribution layer 320 communicate with each other to form the opening 300a. And the opening 300a exposes the connection pad 314. It should be noted that although the redistribution structure 300 illustrated in FIG. 1A includes only two circuit layers (the second circuit layer 311 and the third circuit layer 321), the redistribution structure 300 may include two or more layers in other embodiments.

The heat conductive component 400 is disposed on the circuit structure 200. Specifically, the heat conductive component 400 has a horizontal portion 410 and a vertical portion 420. A part of the horizontal portion 410 is embedded in the redistribution structure 300 and another part of the horizontal portion 410 is exposed by the opening 300a. The vertical portion 420 extends upward from the part of the horizontal portion 410 embedded in the redistribution structure 300 to a position beyond the top surface of the redistribution structure 300. In some embodiments, the heat conductive component 400 is an L-shaped structure. The material of the heat conductive component 400 can be any suitable material with good heat conductivity, such as copper, nickel or silver.

The chip 500 is disposed in the opening 300a and electrically connected to the connection pad 314. Specifically, the chip 500 has a plurality of metal bumps (for example, chip pins) disposed on the bottom thereof, and the metal bumps are connected to the connection pad 314 via a solder. As shown in FIG. 1A, the bottom of the chip 500 contacts the exposed part of the horizontal portion 410 of the heat conductive component 400, thereby providing specific technical effects, that will be described in detail below.

The heat sink 600 is disposed on the redistribution structure 300. Specifically, the heat sink 600 is in contact with a top of the chip 500. Accordingly, when the chip 500 is in operation, accumulated waste heat can be transmitted to the heat sink 600 to avoid the accumulation of waste heat. In some embodiments, the heat sink 600 is bonded to the top of the chip 500 by ultrasonic welding. In the ultrasonic welding, the contact surface of the heat sink 600 and the contact surface of the chip 500 are melted and bonded, so that the heat sink 600 and the chip 500 are in close contact with each other, thereby improving heat dissipation.

As shown in FIG. 1A, the heat sink 600 further contacts a top of the vertical portion 420 of the heat conductive component 400. As mentioned hereinbefore, the bottom of the chip 500 contacts the exposed part of the horizontal portion 410 of the heat conductive component 400. Waste heat built up in the chip 500 can be transmitted from the bottom of the chip 500 to the heat sink 600 through the heat conductive component 400, thereby improving the heat dissipation. In some embodiments, the heat sink 600 is bonded to the top of the vertical portion 420 of the heat conductive component 400 by ultrasonic welding. In the ultrasonic welding, the contact surface of the heat sink 600 and a contact surface of the heat conductive component 400 are melted and bonded, so that the heat sink 600 and the vertical portion 420 are in close contact with each other, thereby improving heat dissipation.

In some embodiments, the chip package structure 10 further includes a protective material 700. Specifically, the protective material 700 covers the side wall of the chip 500 and fills voids between the circuit structure 200 and the chip 500. On the one hand, the protective material 700 protects the bonding between metal bumps of the chip 500 and the connection pad 314, thereby preventing the occurrence of peeling. On the other hand, the protective material 700 can block the moisture and avoid the metal bumps, solder, and second circuit layer 311 from oxidation. In some embodiments, the protective material 700 includes resin but is not limited thereon.

Figure 1B:
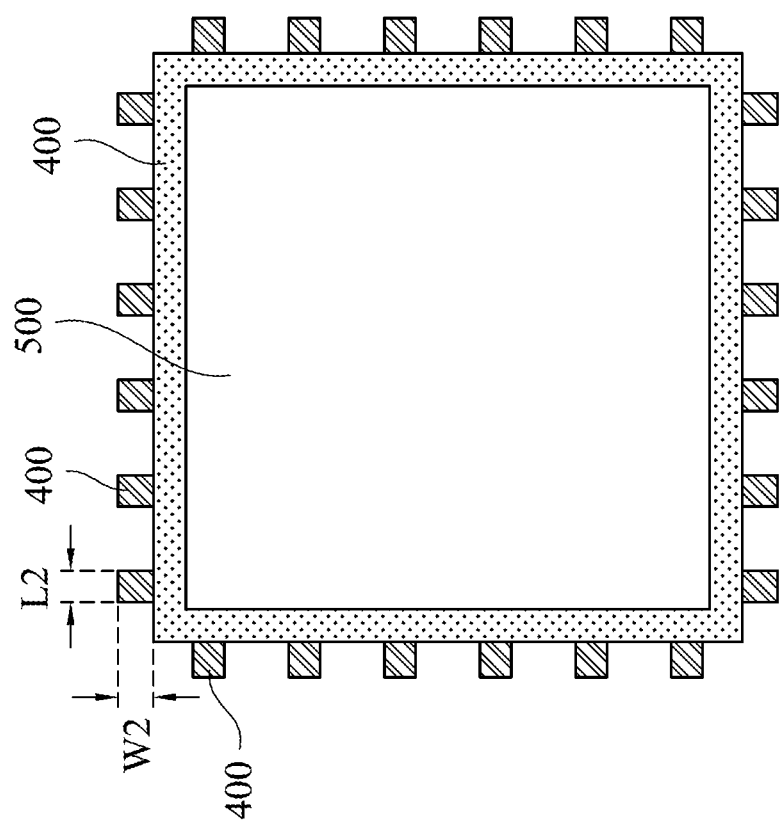
FIG. 1B is a top plan view of a chip and the heat conductive component in the chip package structure according to an embodiment of this disclosure.

It should be noted that although the chip package structure 10 shown in FIG. 1A includes only two heat conductive components 400, it should be understood that the chip package structure 10 includes a number of heat conductive components 400 disposed around the chip 500 when viewed at a different angle. For example, FIG. 1B is a schematic top view illustrating the chip 500 and a number of heat conductive components 400 disposed on the four sides of the chip 500, but is not limited thereto. For example, a plurality of heat conductive components 400 may be disposed only on the two sides or three sides of the chip 500.

The contact surface $A_1$ between the chip 500 and each horizontal portion 410 of the heat conductive component 400 is shown in FIG. 1C. In order to provide good heat dissipation, the total area of all contact surfaces $A_1$ needs to be equal to or greater than 5% of the chip area.

Similarly, to provide good heat dissipation, the vertical portion 420 of the heat conductive component 400 needs to have a specific contact area with the heat sink 600 (as shown in FIG. 1B). The total contact area of the vertical portion 420 needs to be equal to or greater than the total area of all contact surfaces $A_1$.

It is noted that a horizontal distance $D_1$ is present between the side wall of the chip 500 and the vertical portion 420 of the heat conductive component 400, as shown in FIG. 1A, and the horizontal distance $D_1$ is equal to or less than 50 µm, for example. When the horizontal distance $D_1$ is equal to or less than 50 µm, waste heat can directly be transmitted laterally through the other layers (i.e., the protective material 700, the second dielectric layer 312 or the third dielectric layer 322) to the heat conductive component 400 to improve heat dissipation. Specifically, a horizontal distance $D_2$ is present between the side wall of the chip 500 and the second dielectric layer 312 (and/or the third dielectric layer 322). The horizontal distance $D_2$ is less than the horizontal distance $D_1$.

In some embodiments, the chip package structure 10 further includes a connection pad 800. Specifically, the connection pad 800 is disposed between the redistribution structure 300 and the heat sink 600, in which the connection pad 800 contacts the heat sink 600. In addition, the connection pad 800 is in contact with an exposed part of the third conductive contact 323, and thereby the connection pad 800 is electrically connected to the third circuit layer 321. In some embodiments, the connection pad 800 may include any suitable electrically conductive material, such as copper, nickel or silver.

In some embodiments, the chip package structure 10 further includes a solder mask 900. Specifically, the solder mask 900 is disposed between the redistribution structure 300 and the heat sink 600 and covers a side wall of the connection pad 800. In some examples, the solder mask 900 includes a green paint but is not limited thereto.

This disclosure also provides a method for fabricating the chip package structure 10. FIGS. 2 to 10 are cross-sectional views showing the method for manufacturing of the chip package structure 10 in various stages according to an embodiment of the present disclosure.

Figure 2:
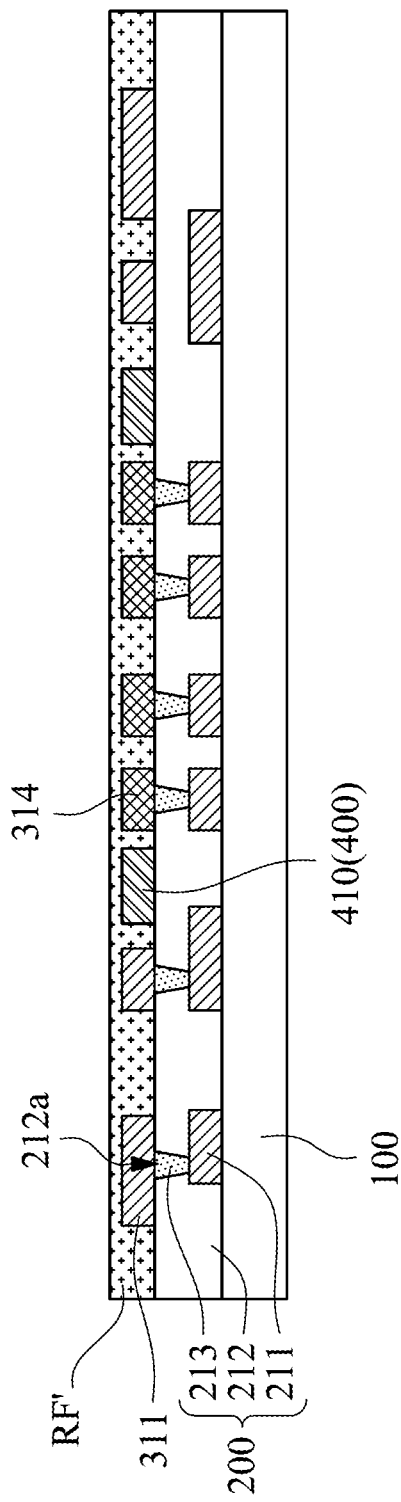
FIGS. 2 to 12 are schematic cross-sectional views illustrating a method of fabricating a chip package structure in various process stages according to various embodiments of this disclosure.

As shown in FIG. 2, a first circuit layer 211 is formed on the substrate 100. For example, a conductive material is formed on the substrate 100 and the conductive material is patterned to form the first circuit layer 211. In some embodiments, the method to form a conductive material includes electroplating, chemical vapor deposition (CVD) or physical vapor deposition (PVD) but is not limited thereto. Next, the first dielectric layer 212 is formed to cover the first circuit layer 211, and the first dielectric layer 212 includes a via 212a exposing a portion of the first circuit layer 211. For example, a dielectric material is formed on the first circuit layer 211, and the dielectric material is patterned to form the via 212a. In some embodiments, the approach of forming the dielectric material includes CVD or PVD, but is not limited thereto. In some embodiments, the approaches of patterning the conductive material and the dielectric material includes forming a patterned photoresist layer by depositing a photoresist on the target layer for patterning, and followed by exposing and developing processes. After that, the target layer is etched using the patterned photoresist layer as a mask. Finally, the patterned photoresist layer is removed. Alternatively, in the embodiment where the dielectric material is a photosensitive dielectric material, a portion of the photosensitive dielectric material may be removed by exposing and developing processes to complete the patterning.

Subsequently, a horizontal portion 410 of a heat conductive component 400, a second circuit layer 311 and a connection pad 314 are formed over the first dielectric layer 212, and a first conductive contact 213 is formed in the via 212a. For example, a conductive material is formed on the first dielectric layer 212 and filled in the via 212a. Thereafter, the conductive material is patterned to form the second circuit layer 311, the connection pad 314, the horizontal portion 410 of the heat conductive component 400 and the first conductive contact 213. And then, a release film RF' is formed to cover the second circuit layer 311, the connection pad 314, the horizontal portion 410 of the heat conductive component 400 and the first dielectric layer 212.

Figure 3:
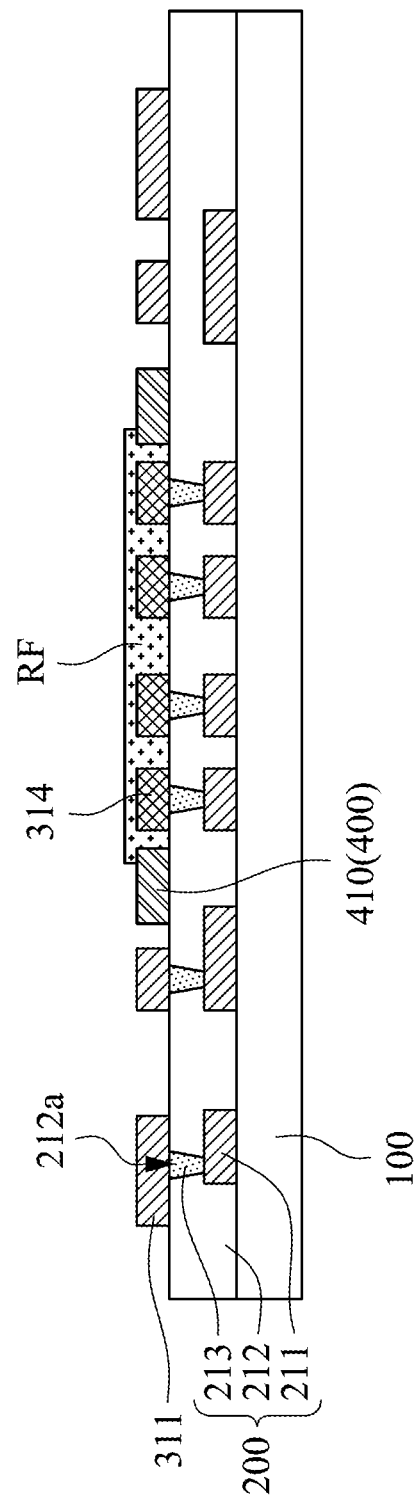

As shown in FIG. 3, the release film RF' is patterned to expose a portion of the second circuit layer 311 and a part of the horizontal portion 410 of the heat conductive component 400, thereby forming a patterned release film RF.

Figure 4:
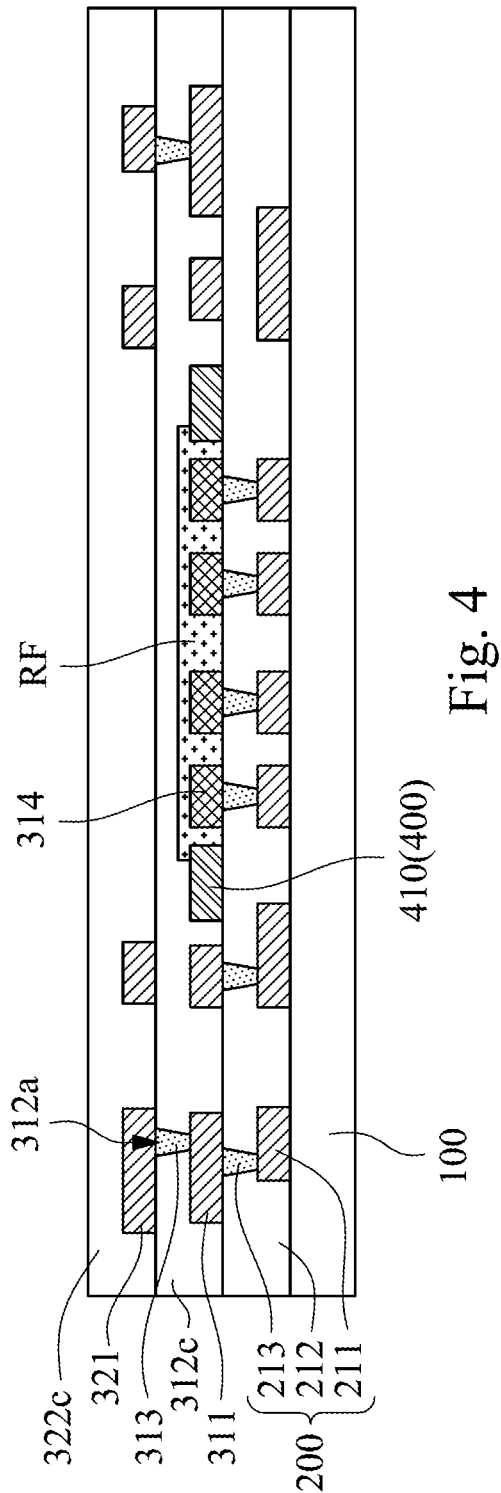

As shown in FIG. 4, a second dielectric layer 312c is formed to cover the second circuit layer 311, the horizontal portion 410 of the heat conductive component 400 and the first dielectric layer 212. The second dielectric layer 312c includes a via 312a exposing a portion of the second circuit layer 311. Next, a third circuit layer 321 is formed on the second dielectric layer 312c, and a second conductive contact 313 is formed in the via 312a. And next, a third dielectric layer 322c is formed to cover the third circuit layer 321 and the second dielectric layer 312c.

Figure 5:
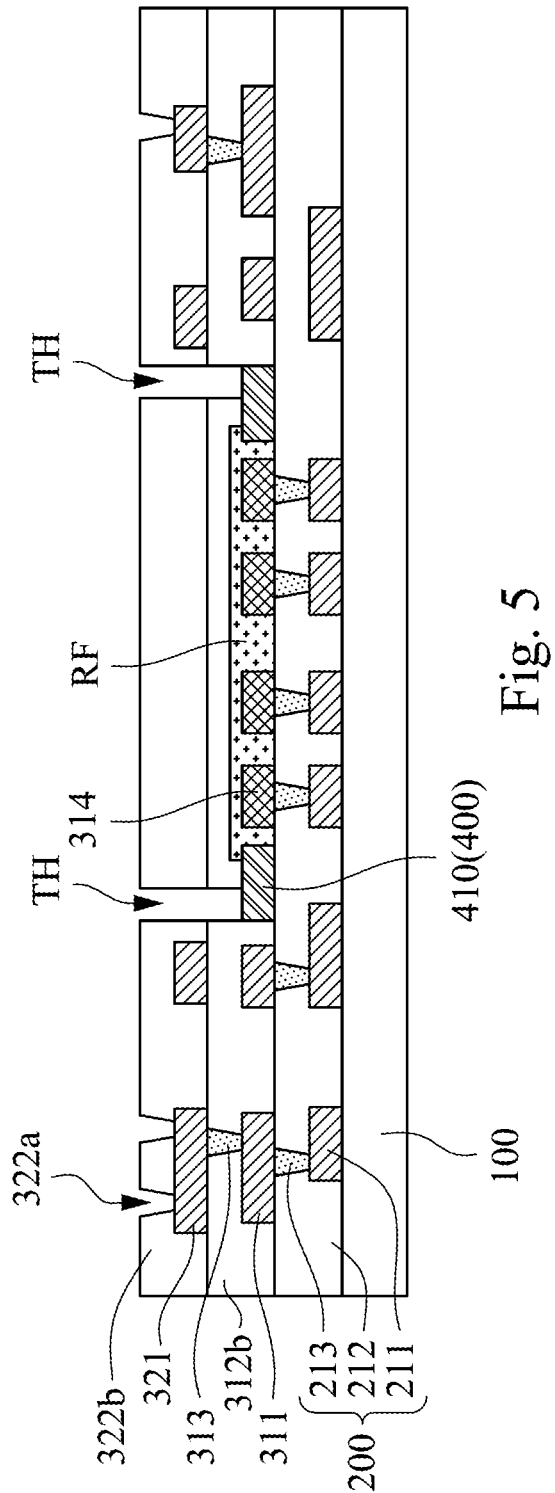

As shown in FIG. 5, the second dielectric layer 312c and the third dielectric layer 322c is patterned to form the second dielectric layer 312b and the third dielectric layer 322b. Specifically, the second dielectric layer 312b and the third dielectric layer 322b together have a through hole TH exposing the horizontal portion 410 of the heat conductive component 400. The third dielectric layer 322b also has via 322a exposing a portion of the third circuit layer 321.

Figure 6:
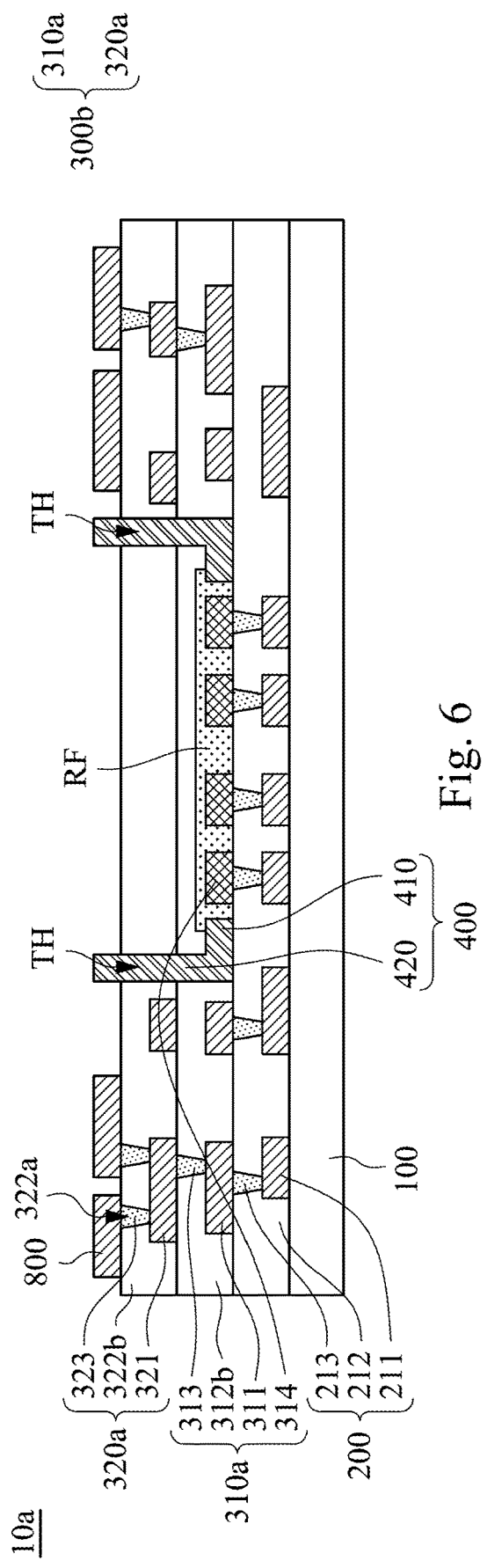

As shown in FIG. 6, at least one connection pad 800 is formed on the third dielectric layer 322b, a third conductive contact 323 is formed in the via 322a, and a vertical portion 420 of the heat conductive component 400 is formed in the through hole TH, thereby forming a precursor structure 10a. For example, a conductive material is formed on the third dielectric layer 322b and is filled in the via 322a and the through hole TH. Next, the conductive material is patterned to form the connection pad 800, the third conductive contact 323 and vertical portion 420 of the heat conductive component 400. Specifically, the precursor structure 10a includes the circuit structure 200, the redistribution precursor structure 300b, the heat conductive component 400 and the patterned release film RF.

Figure 7:
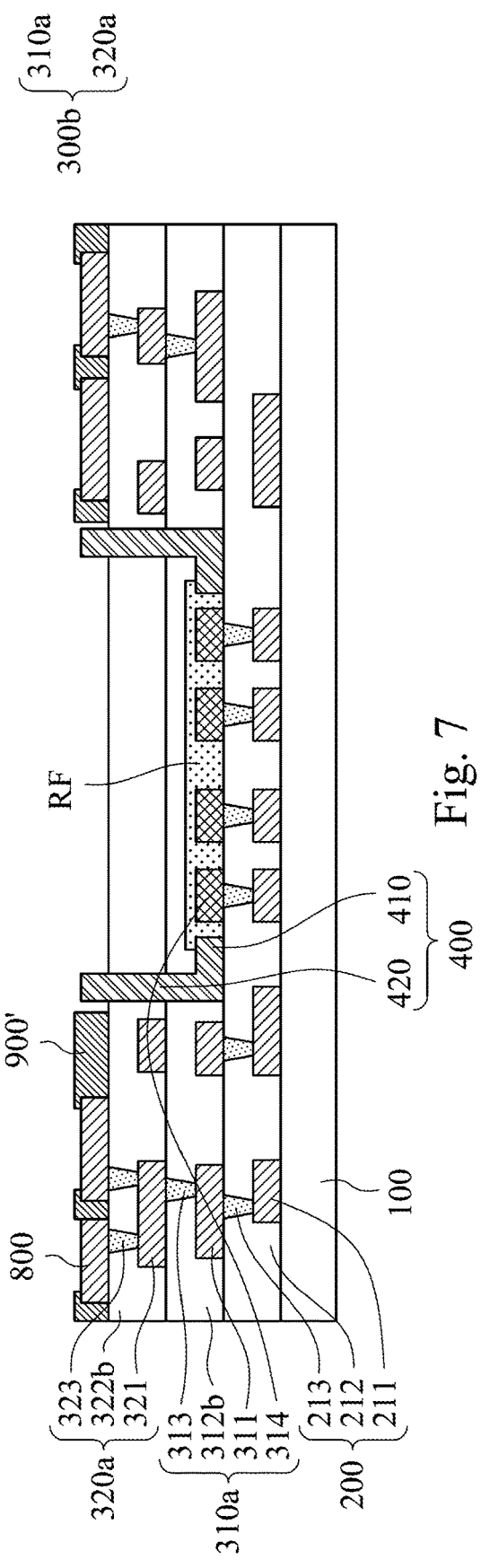

As shown in FIG. 7, a solder mask 900' is formed on the third dielectric layer 322b and the solder mask 900' covers the side wall of the connection pad 800.

Figure 8:
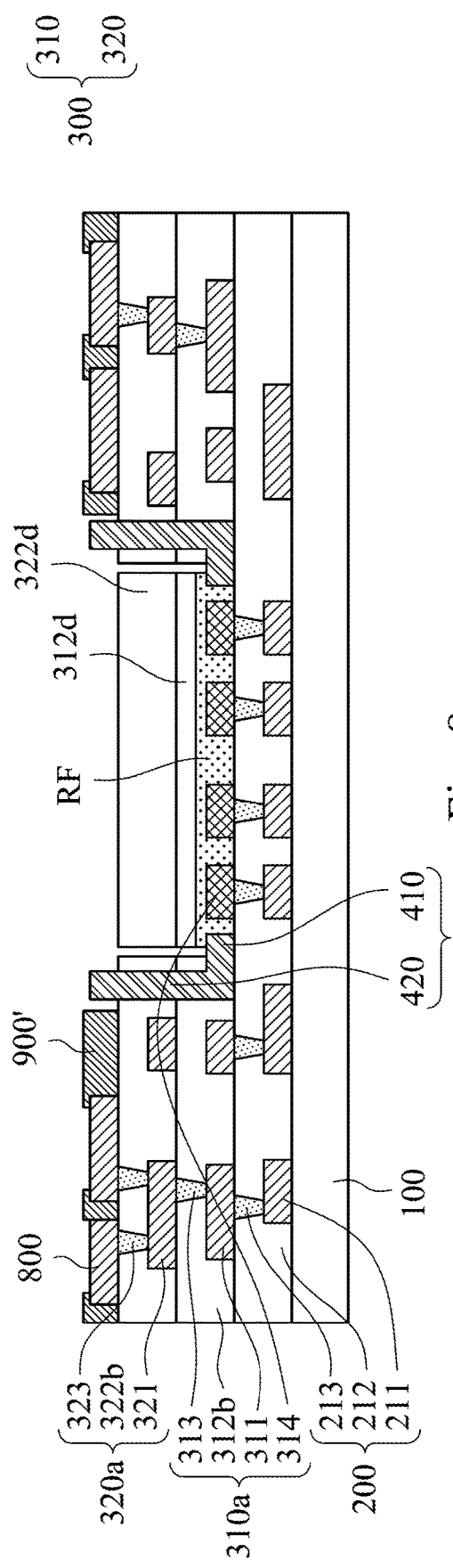

As shown in FIG. 8, a laser drilling process is performed to remove a portion of the second dielectric layer 312b and a portion of the third dielectric layer 322b, that are located over the periphery of the patterned release film RF in a vertical projection direction, thereby forming the second dielectric layer 312, the third dielectric layer 322, and a dielectric layer 312d, 322d located on the patterned release film RF.

Figure 9:
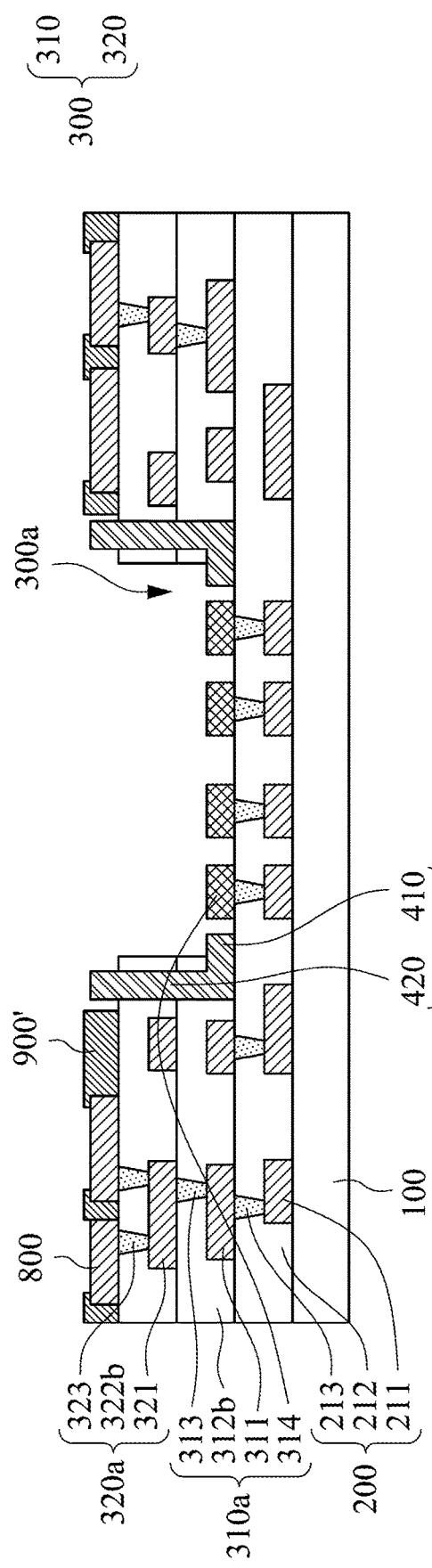

As shown in FIG. 9, the patterned release film RF and the dielectric layer 312d, 322d on the patterned release film RF are removed to form the opening 300a. The opening 300a exposes the connection pad 314 and a part of the horizontal portion 410 of the heat conductive component 400.

Figure 10:
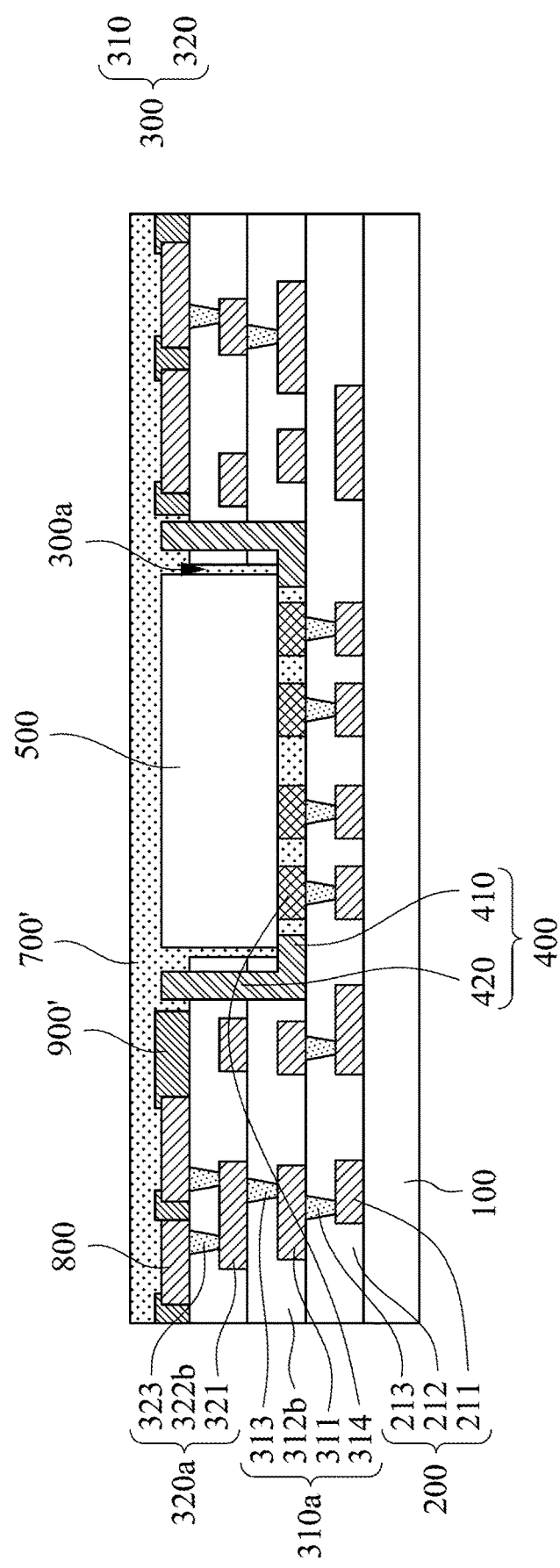

As shown in FIG. 10, a chip 500 is disposed at the opening 300a and is electrically connected to the connection pad 314. The bottom of the chip 500 contacts the exposed part of the horizontal portion 410 of the heat conductive component 400. Next, the protective material 700' is formed to cover the connection pad 800, the solder mask 900', the top surface and the side wall of the chip 500. The protective material 700' also fills the void between the circuit structure 200 and the chip 500.

Next, a planarization process such as a CMP (chemical mechanical polishing) process is performed on the protective material 700' and the solder mask 900' to expose a top of the chip 500 and a top of the vertical portion 420 of the heat conductive component 400. Then, the heat sink 600 is attached to the chip 500 and to the vertical portion 420 by ultrasonic welding to form the chip package structure 10 shown in FIG. 1A.

Figure 11:
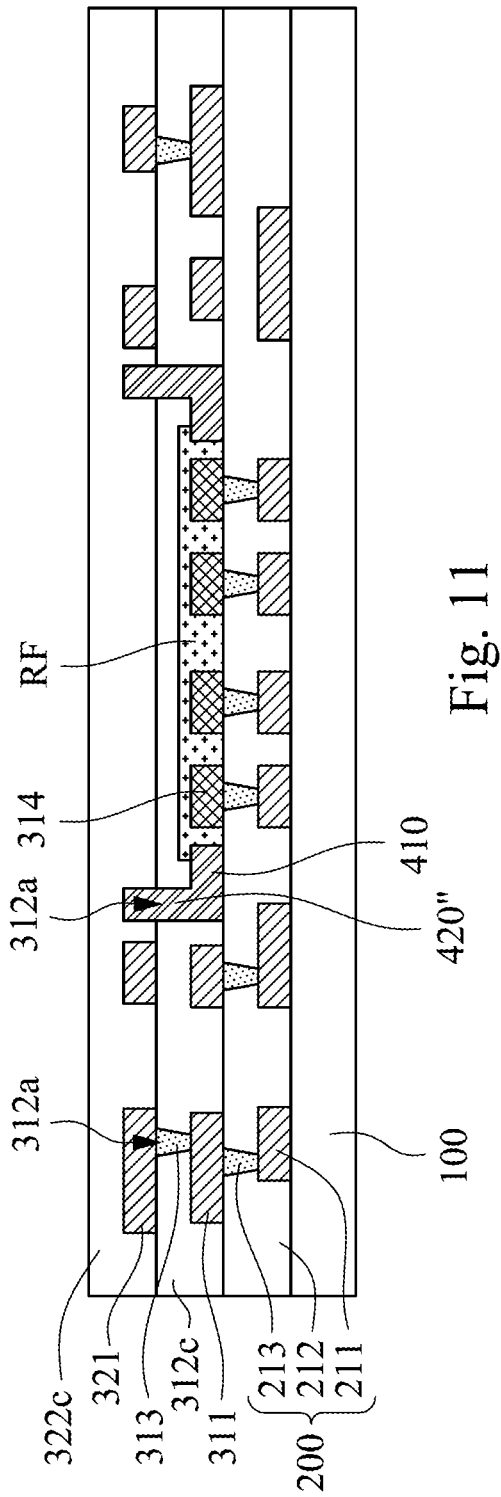

In some embodiments, the vertical portion 420 of the heat conductive component 400 can be formed in a two-stage manner. Concretely speaking, please refer to FIGS. 11 and 12. In FIG. 11, which is continued from FIG. 3, the second dielectric layer 312c is formed to cover the second circuit layer 311, the horizontal portion 410 of the heat conductive component 400 and the first dielectric layer 212. The second dielectric layer 312c includes vias 312a exposing a portion of the second circuit layer 311 and a portion of the horizontal portion 410 of the heat conductive component 400. Next, a third circuit layer 321 is formed on the second dielectric layer 312c, and a second conductive contact 313 and the vertical portion 420" of the heat conductive component 400 are formed in the vias 312a. Subsequently, the third dielectric layer 322c is formed to cover the third circuit layer 321, the vertical portion 420" and the second dielectric layer 312c.

Figure 12:
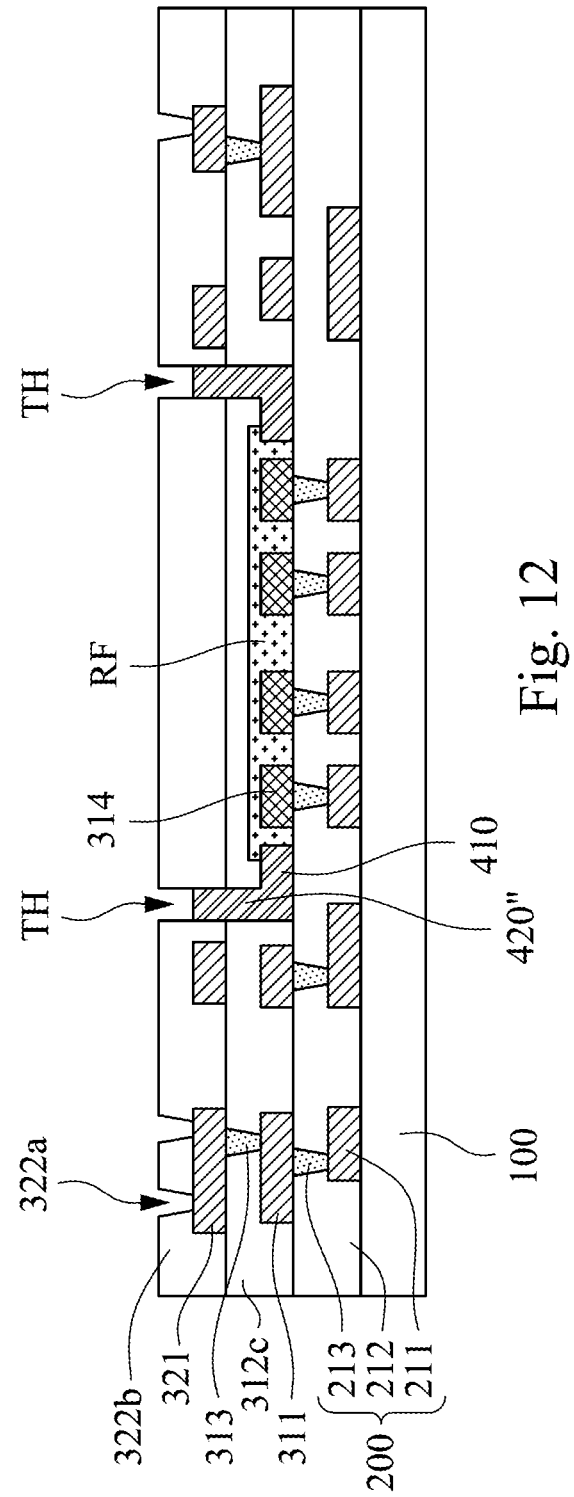

As shown in FIG. 12, a patterning process is performed on the third dielectric layer 322c to form the third dielectric layer 322b. Specifically, the third dielectric layer 322b has a through hole TH exposing the vertical portion 420" of the heat conductive component 400. The third dielectric layer 322b further has a via 322a exposing a portion of the third circuit layer 321. Next, a conductive material is formed on the third dielectric layer 322b and is filled in the via 322a and through hole TH. The conductive material is patterned to form the connection pad 800 (shown in FIG. 6), the third conductive contact 323 and the vertical portion 420 of the heat conductive component 400, thereby forming the precursor structure 10a shown in FIG. 6.

According to the embodiments described above, in the chip package structure disclosed herein, the heat sink is in close contact with the top of the chip so as to provide good heat dissipation. In addition, the chip package structure further has a heat conductive component in close contact with the heat sink so that the waste heat can be transmitted from the bottom of the chip through the heat conductive component to the heat sink. Alternatively, the waste heat may be laterally transmitted from a sidewall of the chip to the vertical portion of the heat conductive component through the layers there between, and then be transmitted to the heat sink, thereby improving heat dissipation.

Although the disclosure is disclosed in the above embodiments, other embodiments are also possible. Therefore, the spirit and scope of the claims are not limited to the description contained in the embodiments herein.

Anyone who is familiar with this skill can understand the disclosure. Without departing from the spirit and scope of the present disclosure, it is desirable to make any change and modification. Therefore, the scope of protection of this disclosure is subject to the definition of the appended claims.

What is claimed is:

1. A chip package structure, comprising:
   a circuit structure having a substrate and a first circuit layer, wherein the substrate has two surfaces opposing to each other and the first circuit layer is disposed on one of the two surfaces;
   a redistribution structure disposed on the circuit structure, wherein the redistribution structure has an opening and a second circuit layer electrically connected to the first circuit layer;
   a heat conductive component disposed over the circuit structure, the component comprising:
      a horizontal portion having a first part embedded in the redistribution structure and a second part exposed by the opening; and
      a vertical portion extending upwardly from the first part of the horizontal portion and exceeding a top surface of the redistribution structure;
   a chip disposed in the opening, wherein the chip has a plurality of electrode pads disposed on a bottom of the chip and the electrode pads are electrically connected with the second circuit layer, and wherein the bottom of the chip directly touches second part of the horizontal portion of the heat conductive component; and
   a heat sink disposed over the redistribution structure and the chip, wherein the heat sink directly touches a top of the chip and a top of the vertical portion of heat conductive component.

2. The chip package structure according to claim 1, wherein the heat conductive component is an L-shaped structure.

3. The chip package structure according to claim 1, wherein the heat sink is attached to the top of the chip and the top of the vertical portion of the heat conductive component by ultrasonic welding.

4. The chip package structure according to claim 1, wherein a horizontal distance equal to or less than 50 µm is present between the vertical portion of the heat conductive component and a side wall of the chip.

5. The chip package structure according to claim 1, further comprising:
   a connection pad disposed between the redistribution structure and the heat sink and being in contact with the heat sink, wherein the connection pad is electrically connected with the second circuit layer.

6. The chip package structure according to claim 1, further comprising:
   a protective material covering a side wall of the chip and filling a void between the circuit structure and the chip.

7. The chip package structure according to claim 1, wherein the horizontal portion extends from the vertical portion to the chip.

* * * * *